United States Patent
Yang et al.

(10) Patent No.: US 10,062,683 B1
(45) Date of Patent: Aug. 28, 2018

(54) COMPOUND SEMICONDUCTOR TRANSISTOR AND HIGH-Q PASSIVE DEVICE SINGLE CHIP INTEGRATION

(71) Applicant: QUALCOMM Incorporated, San Diego, CA (US)

(72) Inventors: Bin Yang, San Diego, CA (US); Xia Li, San Diego, CA (US); Gengming Tao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/587,837

(22) Filed: May 5, 2017

Related U.S. Application Data

(60) Provisional application No. 62/464,114, filed on Feb. 27, 2017.

(51) Int. Cl.
*H01L 29/15* (2006.01)
*H01L 27/06* (2006.01)
(Continued)

(52) U.S. Cl.
CPC .... *H01L 27/0605* (2013.01); *H01L 21/76844* (2013.01); *H01L 21/76846* (2013.01); *H01L 21/76849* (2013.01); *H01L 21/76895* (2013.01); *H01L 21/8252* (2013.01); *H01L 23/535* (2013.01); *H01L 23/53228* (2013.01);
(Continued)

(58) Field of Classification Search
CPC ......... H01L 21/76844; H01L 21/76846; H01L 21/76849; H01L 21/76895; H01L 21/8252; H01L 23/53228; H01L 23/53242; H01L 23/535; H01L 23/66; H01L 27/0605; H01L 28/10; H01L 28/40; H01L 29/20; H01L 29/2003; H01L 29/737
See application file for complete search history.

(56) References Cited

U.S. PATENT DOCUMENTS 7,420,227 B2   9/2008  Chang et al.
8,878,362 B2   11/2014 Cheng
(Continued)

FOREIGN PATENT DOCUMENTS

JP   2014060265 A   4/2014

OTHER PUBLICATIONS

Chang E.Y., et al., "Use of WNX as the Diffusion Barrier for Interconnect Copper Metallization of InGaP-GaAs HBTs", IEEE Transactions on Electron Devices, IEEE Service Center, Piscataway, NJ, US,vol. 51, No. 7, Jul. 1, 2004 (Jul. 1, 2004), pp. 1053-1059, XP011114694, ISSN: 0018-9383, DOI:10.1109/TED. 2004.829862.

(Continued)

*Primary Examiner* — Brook Kebede
(74) *Attorney, Agent, or Firm* — Seyfarth Shaw LLP

(57) ABSTRACT

An integrated compound semiconductor circuit including a high-Q passive device may include a compound semiconductor transistor. The integrated compound semiconductor circuitry may also include a high-Q inductor device. The integrated compound semiconductor may further include a back-end-of-line interconnect layer electrically contacting the high-Q inductor device and the compound semiconductor transistor, the back-end-of-line interconnect layer comprising a gold base layer and a copper interconnect layer.

27 Claims, 11 Drawing Sheets

(51) Int. Cl.
  *H01L 49/02* (2006.01)
  *H01L 29/778* (2006.01)
  *H01L 29/737* (2006.01)
  *H01L 29/20* (2006.01)
  *H01L 23/532* (2006.01)
  *H01L 23/535* (2006.01)
  *H01L 21/8252* (2006.01)
  *H01L 21/768* (2006.01)
  *H01L 23/66* (2006.01)

(52) U.S. Cl.
  CPC ........ *H01L 23/53242* (2013.01); *H01L 23/66* (2013.01); *H01L 28/10* (2013.01); *H01L 28/40* (2013.01); *H01L 29/20* (2013.01); *H01L 29/2003* (2013.01); *H01L 29/737* (2013.01); *H01L 29/7786* (2013.01); *H01L 2223/6616* (2013.01); *H01L 2223/6672* (2013.01); *H01L 2223/6677* (2013.01)

(56) References Cited

U.S. PATENT DOCUMENTS

| | | |
|---|---|---|
| 9,093,506 B2 | 7/2015 | Shen |
| 2004/0081811 A1 | 4/2004 | Casper et al. |
| 2006/0049524 A1 | 3/2006 | Lin et al. |
| 2008/0042762 A1 | 2/2008 | Yang et al. |
| 2009/0309662 A1 | 12/2009 | Yang et al. |
| 2010/0289126 A1* | 11/2010 | Pagaila ............. H01L 23/49822 257/659 |
| 2011/0134613 A1* | 6/2011 | Moussaoui ......... H01L 23/3107 361/737 |
| 2013/0207266 A1 | 8/2013 | Hua et al. |
| 2013/0221528 A1 | 8/2013 | Cheng et al. |
| 2014/0209926 A1 | 7/2014 | Takatani et al. |
| 2015/0206870 A1 | 7/2015 | Takatani et al. |

OTHER PUBLICATIONS

International Search Report and Written Opinion—PCT/US2018/012042—ISA/EPO—Apr. 26, 2018.

* cited by examiner

COMPOUND SEMICONDUCTOR TRANSISTOR AND HIGH-Q PASSIVE DEVICE SINGLE CHIP INTEGRATION

CROSS-REFERENCE TO RELATED APPLICATION

The present application claims the benefit of U.S. Provisional Patent Application No. 62/464,114, filed on Feb. 27, 2017, and titled "COMPOUND SEMICONDUCTOR TRANSISTOR AND HIGH-Q PASSIVE DEVICE SINGLE CHIP INTEGRATION," the disclosure of which is expressly incorporated by reference herein in its entirety.

BACKGROUND

Field

The present disclosure relates generally to compound semiconductor devices, and more specifically, to a compound semiconductor transistor and high-Q passive device single chip integration.

Background

A wireless device (e.g., a cellular phone or a smartphone) in a wireless communication system may include a radio frequency (RF) transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The transmit section of the mobile RF transceiver may amplify and transmit a communication signal. The transmit section may include one or more circuits for amplifying and transmitting the communication signal. The amplifier circuits may include one or more amplifier stages that may have one or more driver stages and one or more power amplifier stages. Each of the amplifier stages includes one or more transistors configured in various ways to amplify the communication signal. The transistors configured to amplify the communication signal are generally selected to operate at substantially higher frequencies for supporting communication enhancements, such as carrier aggregation. These transistors are commonly implemented using compound semiconductor transistors, such as bipolar junction transistors (BJTs), heterojunction bipolar transistors (HBTs), and the like.

Further design challenges for mobile RF transceivers include analog/RF performance considerations, including mismatch, noise, and other performance considerations. The design of these mobile RF transceivers includes the use of additional passive devices, for example, to suppress resonance, and/or to perform filtering, bypassing, and coupling. Unfortunately, integration of passive devices and compound semiconductor transistors is problematic.

SUMMARY

An integrated compound semiconductor circuit including a high-Q passive device may include a compound semiconductor transistor. The integrated compound semiconductor circuitry may also include a high-Q inductor device. The integrated compound semiconductor may further include a back-end-of-line interconnect layer electrically contacting the high-Q inductor device and the compound semiconductor transistor, the back-end-of-line interconnect layer comprising a gold base layer and a copper interconnect layer.

A method of making an integrated compound semiconductor circuit including a high-Q passive device may include fabricating a compound semiconductor transistor. The method of making an integrated compound semiconductor circuit may also include fabricating a high-Q inductor device. The method of making an integrated compound semiconductor circuitry may further include depositing a back-end-of-line interconnect layer of a gold base layer and a copper interconnect layer to electrically contact the high-Q inductor device and the compound semiconductor transistor.

A radio frequency (RF) front end module may include a chip. The chip may include a compound semiconductor transistor, a high-Q inductor device, and a back-end-of-line interconnect layer electrically contacting the high-Q inductor device and the compound semiconductor transistor, the back-end-of-line interconnect layer comprising a gold base layer and a copper interconnect layer. The RF may also include an antenna coupled to an output of the chip.

An integrated compound semiconductor circuit may include a compound semiconductor transistor. The integrated compound semiconductor circuitry may also include a means for providing inductance. The integrated compound semiconductor circuit may further include a back-end-of-line interconnect layer electrically contacting the means for providing inductance and the compound semiconductor transistor, the back-end-of-line interconnect layer comprising a gold base layer and a copper interconnect layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
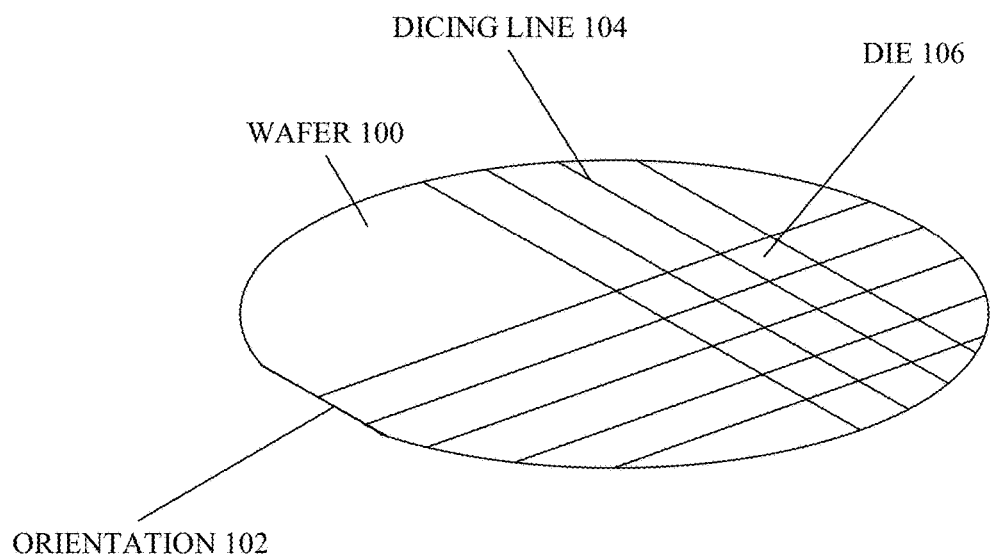
FIG. 1 illustrates a perspective view of a semiconductor wafer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

The term "exemplary" used throughout this description means "serving as an example, instance, or illustration," and should not necessarily be construed as preferred or advantageous over other aspects of the present disclosure. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

Fabrication of mobile radio frequency (RF) chip designs (e.g., mobile RF transceivers) becomes complex at deep sub-micron process nodes due to cost and power consumption considerations. A mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The transmit section of the mobile RF transceiver may amplify and transmit a communication signal. The transmit section may include one or more circuits for amplifying and transmitting the communication signal. The amplifier circuits may include one or more amplifier stages that may have one or more driver stages and one or more power amplifier stages. Each of the amplifier stages includes one or more transistors configured in various ways to amplify the communication signal. The transistors configured to amplify the communication signal are generally selected to operate at substantially higher frequencies for supporting communication enhancements, such as carrier aggregation. These transistors are commonly implemented using compound semiconductor transistors, such as bipolar junction transistors (BJTs), heterojunction bipolar transistors (HBTs), high electron mobility transistors (HEMTs), a pseudomorphic high electron mobility transistor (pHEMT), and the like.

Further design challenges for mobile RF transceivers include analog/RF performance considerations, including mismatch, noise, and other performance considerations. The design of these mobile RF transceivers includes the use of additional passive devices, for example, to suppress resonance, and/or to perform filtering, bypassing, and coupling. Unfortunately, integration of passive devices and compound semiconductor transistors, such as bipolar transistors, is problematic.

Bipolar transistors, which are also referred to as bipolar junction transistors (BJTs), are a type of transistor that uses both hole charge and electron carriers. Bipolar transistors are fabricated in integrated circuits and are also used as individual components. Bipolar transistors are designed to amplify current. This basic function of bipolar transistors makes them a logical choice for implementing amplifiers and switches. As a result, bipolar transistors are widely used in electronic equipment, such as cellular phones, audio amplifiers, and radio transmitters.

A heterojunction bipolar transistor (HBT) is a type of bipolar transistor that uses different semiconductor materials for emitters and base regions of the device, which create a heterojunction. A heterojunction bipolar transistor may use a III-V compound semiconductor material, a II-VI compound semiconductor material, or other like compound semiconductor material. III-V (and II-VI) compound semiconductor materials generally exhibit high carrier mobility and direct energy gaps, which make these compound semiconductor materials useful for optoelectronics. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chips including RF power amplifiers in mobile RF transceivers.

Integration of passive devices and compound semiconductor transistors involves various analog inductors, capacitors, and resistors that are fundamental to RF applications. These analog devices are generally separate from the RF digital circuits that are fabricated using silicon based CMOS transistors. These silicon based CMOS transistors are used to manufacture RF digital circuits because highly complex and highly integrated baseband and transceiver RF integrated circuits involve advanced, reduced gate-length CMOS processes for integrating functions in very small die. For example, within an RF front end module, CMOS processes are used to manufacture the switch as well as the digital controls. Improved integration of compound semiconductor heterojunction bipolar transistors and analog passive devices is desired for supporting RF applications. The compound semiconductor transistors form power amplifiers and integrate with analog passive devices, separate from the RF digital circuits.

Successful fabrication of modern semiconductor chip products, such as integrated compound semiconductor transistors and passive devices, involves interplay between the materials and the processes employed. The process flow for semiconductor fabrication of the integrated circuit structure may include front-end-of-line (FEOL) processes, middleof-line (MOL) (also referred to as middle-end-of-line (MEOL)) processes, and back-end-of-line (BEOL) processes to form back-end-of-line interconnect layers (e.g., M1, M2, M3, M4, etc.) The front-end-of-line processes may include the set of process steps that form the active devices, such as transistors.

The front-end-of-line processes include ion implantation, anneals, oxidation, chemical vapor deposition (CVD) or atomic layer deposition (ALD), etching, chemical mechanical polishing (CMP), and epitaxy. The middle-of-line processes may include the set of process steps that enable connection of the transistors to back-end-of-line interconnects. These steps include silicidation and contact formation as well as stress introduction. The back-end-of-line processes may include the set of process steps that form the interconnects that tie the independent transistors and form circuits. Although the silicon (Si) CMOS (complementary metal oxide semiconductor) industry uses copper to fabricate the back-end-of-line interconnects, the compound semiconductor transistor industry generally uses gold for their back-end-of-line interconnect layer.

A heterojunction bipolar transistor (HBT) is one example of a compound semiconductor transistor. A heterojunction bipolar transistor integrated circuit (HBT chip) may integrate a resistor, a capacitor, and a heterojunction bipolar transistor to provide, for example, a power amplifier. The compound semiconductor industry, however, continues to use a relatively thin gold back-end-of-line (BEOL) interconnect layer (e.g., in the range of 4 micrometers (um)). The compound semiconductor industry desires a single chip integration with a high-quality (Q) inductor in small form-factor devices (e.g., smartphones). Unfortunately, high-Q inductors specify a thick back-end-of-line interconnect layer (e.g., >8 um).

Aspects of the present disclosure may solve this problem by replacing the gold back-end-of-line interconnect layer with a copper back-end-of-line interconnect layer. In one configuration, a compound semiconductor circuit is integrated with a high-Q passive device using a copper layer in a back-end-of-line interconnect layer. One of the many benefits of using copper as a compound semiconductor (e.g., III-V, II-VI) back-end-of-line interconnect layer is reduced cost. In particular, using a thicker gold interconnect layer to implement a high-Q inductor increases wafer cost because the price of gold is approximately 7000 times greater than the price of copper. As a result, replacing gold with copper is a big cost driver for using a copper back-end-of-line interconnect layer.

In addition, a thermal conductivity of copper is approximately 1.4 times greater than the thermal conductivity of gold. A copper back-end-of-line interconnect layer, therefore, also solves a known heterojunction bipolar transistor thermal issue due to the substantially higher frequencies supported by compound semiconductor transistors. A copper back-end-of-line interconnect layer also enables a low cost integration of a compound semiconductor transistor (e.g., compound semiconductor field effect transistor, a heterojunction bipolar transistor, a high-electron-mobility-transistor (HEMT), etc.) with a high-Q inductor and a high density metal-insulator-metal (MIM) capacitor (CAP).

FIG. 1 illustrates a perspective view of a semiconductor wafer. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystallizes onto the seed crystal in the orientation of the crystal.

The wafer 100 may be a compound material, such as gallium arsenide (GaAs, InP) or gallium nitride (GaN), a ternary material such as indium gallium arsenide (InGaAs, AlGaAs, InGaSb), quaternary materials (InGaAsP), or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
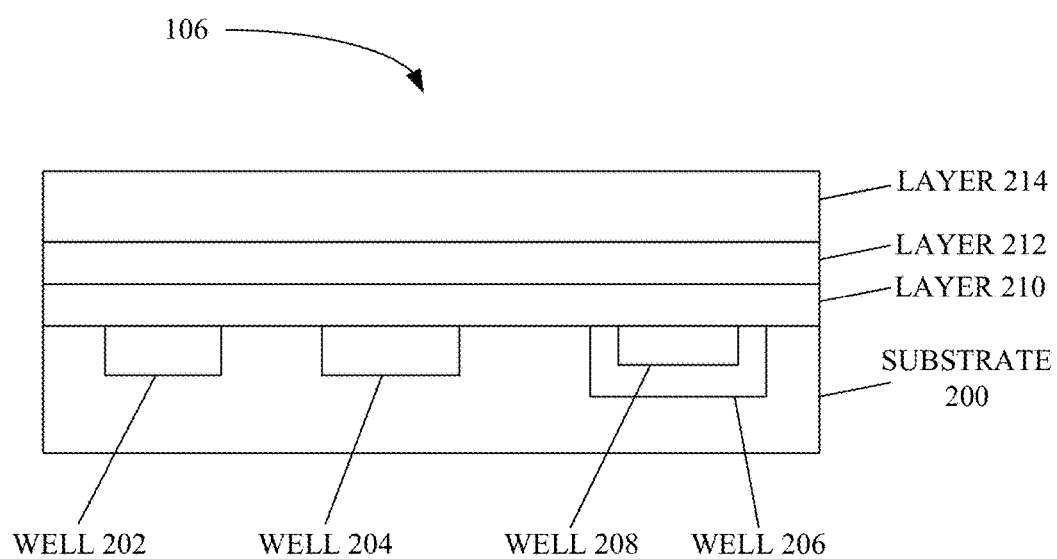
FIG. 2 illustrates a cross-sectional view of a die.

FIG. 2 illustrates a cross-sectional view of a die 106. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

The semiconductor substrate may also have a well 206 and a well 208. The well 208 may be completely within the well 206, and, in some cases, may form a bipolar junction transistor (BJT), a heterojunction bipolar transistor (HBT), a high electron mobility transistor (HEMT), a pseudomorphic high electron mobility transistor (pHEMT), or other like compound semiconductor transistor. The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as gold, copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure. According to aspects of the present disclosure, a compound semiconductor circuit is integrated with a high-Q passive device using a copper layer in a back-end-of-line interconnect layer.

A heterojunction bipolar transistor (HBT) is a type of bipolar transistor that uses different semiconductor materials for emitters and base regions of the device, which creates a heterojunction. A heterojunction bipolar transistor may use a III-V compound semiconductor material, a II-VI compound semiconductor material, or other like compound semiconductor material. III-V (and II-VI) compound semiconductor materials generally exhibit high carrier mobility and direct energy gaps. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs including RF power amplifiers in mobile RF transceivers of a radio frequency (RF) front end module, for example, as shown in FIG. 3.

Figure 3:
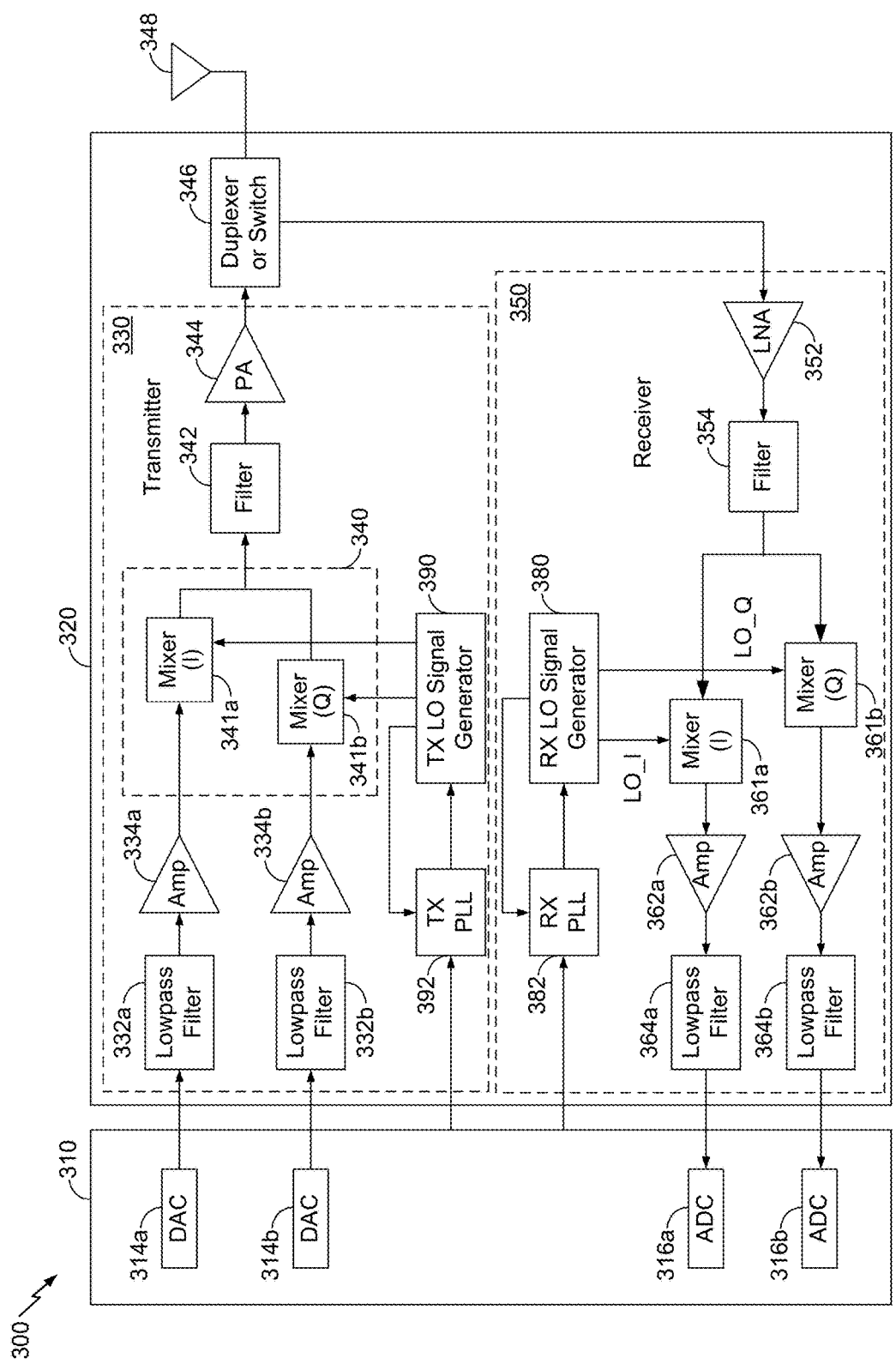
FIG. 3 shows a block diagram of an exemplary wireless device.

FIG. 3 shows a block diagram of an exemplary design of a wireless device 300. FIG. 3 shows an example of a transceiver 320, which may be a wireless transceiver (WTR). In general, the conditioning of the signals in a transmitter 330 and a receiver 350 may be performed by one or more stages of amplifier(s), filter(s), upconverters, downconverters, and the like. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, the wireless device 300 generally includes the transceiver 320 and a data processor 310. The data processor 310 may include a memory (not shown) to store data and program codes, and may generally include analog and digital processing elements. The transceiver 320 may include the transmitter 330 and receiver 350 that support bi-directional communication. In general, the wireless device 300 may include any number of transmitters and/or receivers for any number of communication systems and frequency bands. All or a portion of the transceiver 320 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and then from intermediate frequency to baseband in another stage for a receiver. In the direct-conversion architecture, a signal is frequency converted between radio frequency and baseband in one stage. The super-heterodyne and direct-conversion architectures may use different circuit blocks and/or have different requirements. In the example shown in FIG. 3, the transmitter 330 and the receiver 350 are implemented with the direct-conversion architecture.

In a transmit path, the data processor 310 processes data to be transmitted. The data processor 310 also provides in-phase (I) and quadrature (Q) analog output signals to the transmitter 330 in the transmit path. In an exemplary aspect, the data processor 310 includes digital-to-analog-converters (DACs) 314a and 314b for converting digital signals generated by the data processor 310 into the in-phase (I) and quadrature (Q) analog output signals (e.g., I and Q output currents) for further processing.

Within the transmitter 330, lowpass filters 332a and 332b filter the in-phase (I) and quadrature (Q) analog transmit signals, respectively, to remove undesired images caused by the prior digital-to-analog conversion. Amplifiers (Amp) 334a and 334b amplify the signals from lowpass filters 332a and 332b, respectively, and provide in-phase (I) and quadrature (Q) baseband signals. An upconverter 340 upconverts the in-phase (I) and quadrature (Q) baseband signals with in-phase (I) and quadrature (Q) transmit (TX) local oscillator (LO) signals from a TX LO signal generator 390 to provide an upconverted signal. A filter 342 filters the upconverted signal to remove undesired images caused by the frequency upconversion as well as noise in a receive frequency band. A power amplifier (PA) 344 amplifies the signal from the filter 342 to obtain the desired output power level and provides a transmit radio frequency signal. The transmit radio frequency signal is routed through a duplexer/switch 346 and transmitted via an antenna 348.

In a receive path, the antenna 348 receives communication signals and provides a received radio frequency (RF) signal, which is routed through the duplexer/switch 346 and provided to a low noise amplifier (LNA) 352. The duplexer/switch 346 is designed to operate with a specific receive (RX) to transmit (TX) (RX-to-TX) duplexer frequency separation, such that RX signals are isolated from TX signals. The received RF signal is amplified by the LNA 352 and filtered by a filter 354 to obtain a desired RF input signal. Downconversion mixers 361a and 361b mix the output of the filter 354 with in-phase (I) and quadrature (Q) receive (RX) LO signals (i.e., LO_I and LO_Q) from an RX LO signal generator 380 to generate in-phase (I) and quadrature (Q) baseband signals. The in-phase (I) and quadrature (Q) baseband signals are amplified by amplifiers 362a and 362b and further filtered by lowpass filters 364a and 364b to obtain in-phase (I) and quadrature (Q) analog input signals, which are provided to the data processor 310. In the exemplary configuration shown, the data processor 310 includes analog-to-digital-converters (ADCs) 316a and 316b for converting the analog input signals into digital signals for further processing by the data processor 310.

In FIG. 3, the transmit local oscillator (TX LO) signal generator 390 generates the in-phase (I) and quadrature (Q) TX LO signals used for frequency upconversion, while a receive local oscillator (RX LO) signal generator 380 generates the in-phase (I) and quadrature (Q) RX LO signals used for frequency downconversion. Each LO signal is a periodic signal with a particular fundamental frequency. A phase locked loop (PLL) 392 receives timing information from the data processor 310 and generates a control signal used to adjust the frequency and/or phase of the TX LO signals from the TX LO signal generator 390. Similarly, a PLL 382 receives timing information from the data processor 310 and generates a control signal used to adjust the frequency and/or phase of the RX LO signals from the RX LO signal generator 380.

The wireless device 300 may support carrier aggregation and may (i) receive multiple downlink signals transmitted by one or more cells on multiple downlink carriers at different frequencies and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

A power amplifier 344 may include one or more stages having, for example, driver stages, power amplifier stages, or other components, that can be configured to amplify a communication signal on one or more frequencies, in one or more frequency bands, and at one or more power levels. The transistors configured to amplify the communication signal, however, are generally selected to operate at substantially higher frequencies. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs specifying high power efficiency including RF power amplifiers in mobile RF transceivers.

Integration of passive devices and compound semiconductor transistors involves various analog inductors, capacitors, and resistors that are fundamental to RF applications. These analog devices are generally separate from the RF digital circuits that are fabricated using silicon based CMOS transistors. Aspects of the present disclosure may improve integration of compound semiconductor heterojunction bipolar transistors and analog passive devices for supporting RF applications. The compound semiconductor transistors form power amplifiers and integrate the analog passive devices, separate from the RF digital circuits.

Figure 4:
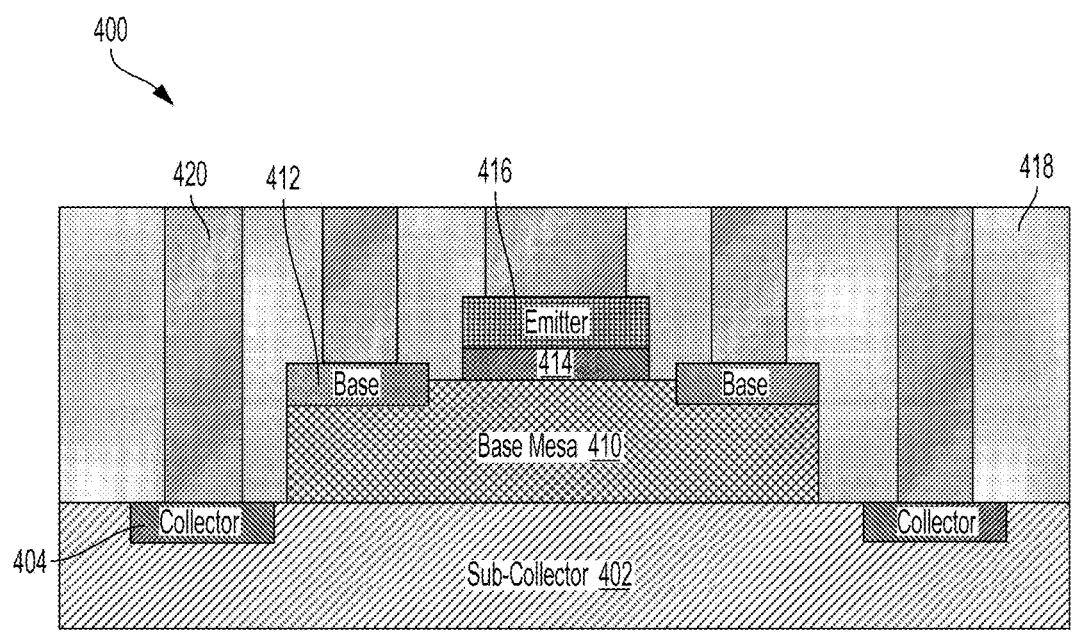
FIG. 4 illustrates a cross-sectional view of a conventional heterojunction bipolar transistor (HBT).

The compound semiconductor industry desires a single chip integration with a high-quality (Q) inductor in small form-factor devices (e.g., smartphones). For example, a heterojunction bipolar transistor integrated circuit (HBT chip) may integrate a resistor, a capacitor, and a heterojunction bipolar transistor to provide, for example, a power amplifier. The compound semiconductor industry, however, continues to use a relatively thin gold back-end-of-line (BEOL) interconnect layer (e.g., in the range of 4 micrometers (um)), for example, as shown in FIG. 4. Unfortunately, a high-Q inductor specifies a thick back-end-of-line interconnect layer (e.g., >8 um).

FIG. 4 shows a heterojunction bipolar transistor (HBT) device that includes a thin, gold back-end-of-line (BEOL) interconnect layer. The HBT device 400 includes a sub-collector 402 supporting a base mesa 410 that includes a collector layer (not shown) on the sub-collector 402 and a base layer on the collector layer (not shown). An emitter 414 is arranged on the base mesa 410. The HBT device 400 also includes a collector contact 404 on the sub-collector 402, a base contact 412 coupled to the base mesa 410, and an emitter contact 416 electrically coupled to the emitter 414. A dielectric layer 418 covers the sub-collector 402, the base mesa 410, the emitter 414, and their respective conductive contacts.

In this arrangement, back-end-of-line interconnects 420 are formed in the dielectric layer 418, and are coupled to each of the collector contact 404, the base contact 412, and the emitter contact 416. As noted above, the compound semiconductor industry uses a thin gold back-end-of-line interconnect layer. Integration with an analog passive device, such as a high-Q inductor may specify a thick back-end-of-line interconnect layer. Because the back-end-of-line interconnects 420 are made from a thin gold layer, the high cost of gold prohibits the formation of a high-Q inductor using a thick gold layer.

A heterojunction bipolar transistor chip may integrate a resistor, a capacitor, and a heterojunction bipolar transistor to provide, for example, a power amplifier using a relatively thin gold back-end-of-line interconnect layer. The future compound semiconductor industry, however, specifies single chip integration with a high-quality (Q) inductor in a small form-factor device. Unfortunately, high-Q inductors specify a thick back-end-of-line interconnect layer that is unduly expensive to fabricate using a thick back-end-of-line gold layer. Aspects of the present disclosure may solve this problem by replacing the gold back-end-of-line layer with a copper back-end-of-line layer.

Figure 5:
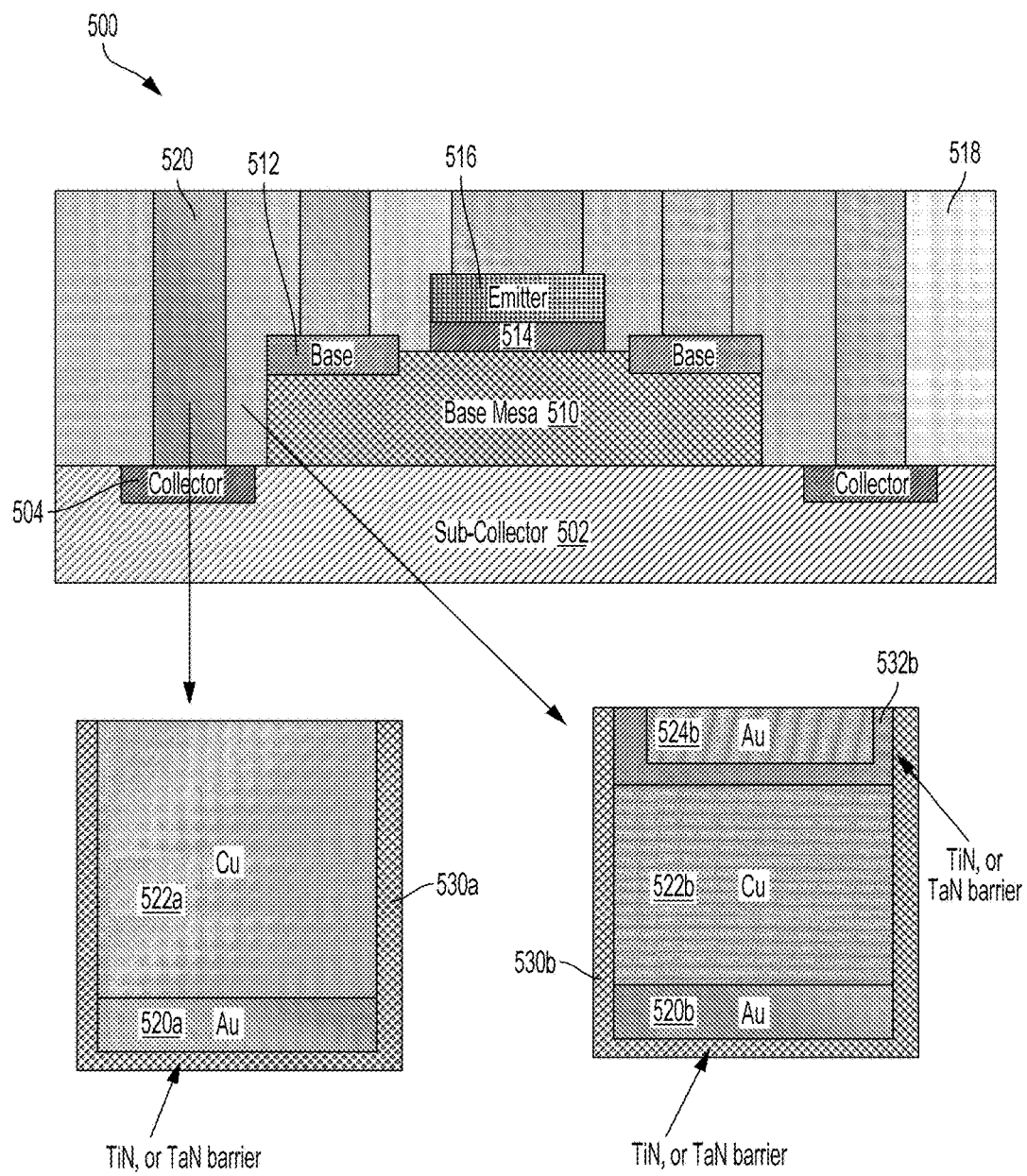
FIG. 5 illustrates a cross-sectional view of a back-end-of-line (BEOL) interconnect layer according to aspects of the present disclosure.

FIG. 5 illustrates a cross-sectional view of a heterojunction bipolar transistor (HBT) device with a back-end-of-line interconnect layer 520 according to aspects of the present disclosure. The HBT device 500 may include a sub-collector layer 502 supporting a base mesa 510 and an emitter layer 514. The base mesa 510 may include a collector layer and a base layer on the collector layer (not shown). The HBT device 500 may further include a collector contact 504 coupled to the sub-collector layer 502. The HBT device 500 also includes a base contact 512 coupled to the base mesa 510, and emitter contact 516 coupled to the emitter layer 514.

A dielectric layer 518 may cover the sub-collector layer 502, the base mesa 510, the emitter layer 514, and their respective conductive contacts. In addition, a back-end-of-line interconnect layer 520 may be formed in the dielectric layer 518, and may be coupled to each of the collector contact 504, the base contact 512, and the emitter contact 516.

According to an aspect, the back-end-of-line interconnect layer 520 may include a first layer 520a supporting a second layer 522a. For example, the first layer 520a may be a thin gold base layer, and the second layer 522a be a thick copper interconnect layer. A barrier liner 530a may surround both the first layer 520a and the second layer 522a. For example, the barrier liner 530a may be a copper diffusion barrier layer that includes titanium nitride (TiN) or a tantalum nitride (TaN).

According to another aspect, the back-end-of-line interconnect layer 520 may include a first layer 520b supporting a second layer 522b. The second layer 522b may be capped by a gold capping layer 524b. For example, the first layer 520a may be a thin gold base layer, and the second layer 522a may be a thick copper interconnect layer. A barrier liner 530b may surround the first layer 520b, the second layer 522b, and the gold capping layer 524b. For example, the barrier liner 530b may be a copper diffusion barrier layer that includes titanium nitride (TiN) or a tantalum nitride (TaN). The gold capping layer 524b may further include a capping barrier liner 532b. The capping barrier liner 532b may also include titanium nitride (TiN) or a tantalum nitride (TaN).

According to additional aspects of the present disclosure, a wetting layer (not shown) may support the first layer 520a, 520b. For example, the wetting layer may include titanium-tungsten-nitride (TiWN). In accordance with aspects of the present disclosure, any combination of layers of titanium-tungsten-nitride (TiWN), gold (Au), titanium nitride (TiN) or a tantalum nitride (TaN) (e.g., TiN/TaN), and copper (Cu) may be used to form the back-end-of-line interconnect layer 520 as described herein. For example, the layers may include any combination of TiWN/Au/TiN/Cu, TiWN/Au/TaN/Cu, TiWN/Au/TiN/Cu/Au, TiWN/Au/TiN/Cu/TiN/Au, TiWN/Au/TaN/Cu/Au, TiWN/Au/TaN/Cu/TaN/Au, etc.

Figure 6A:
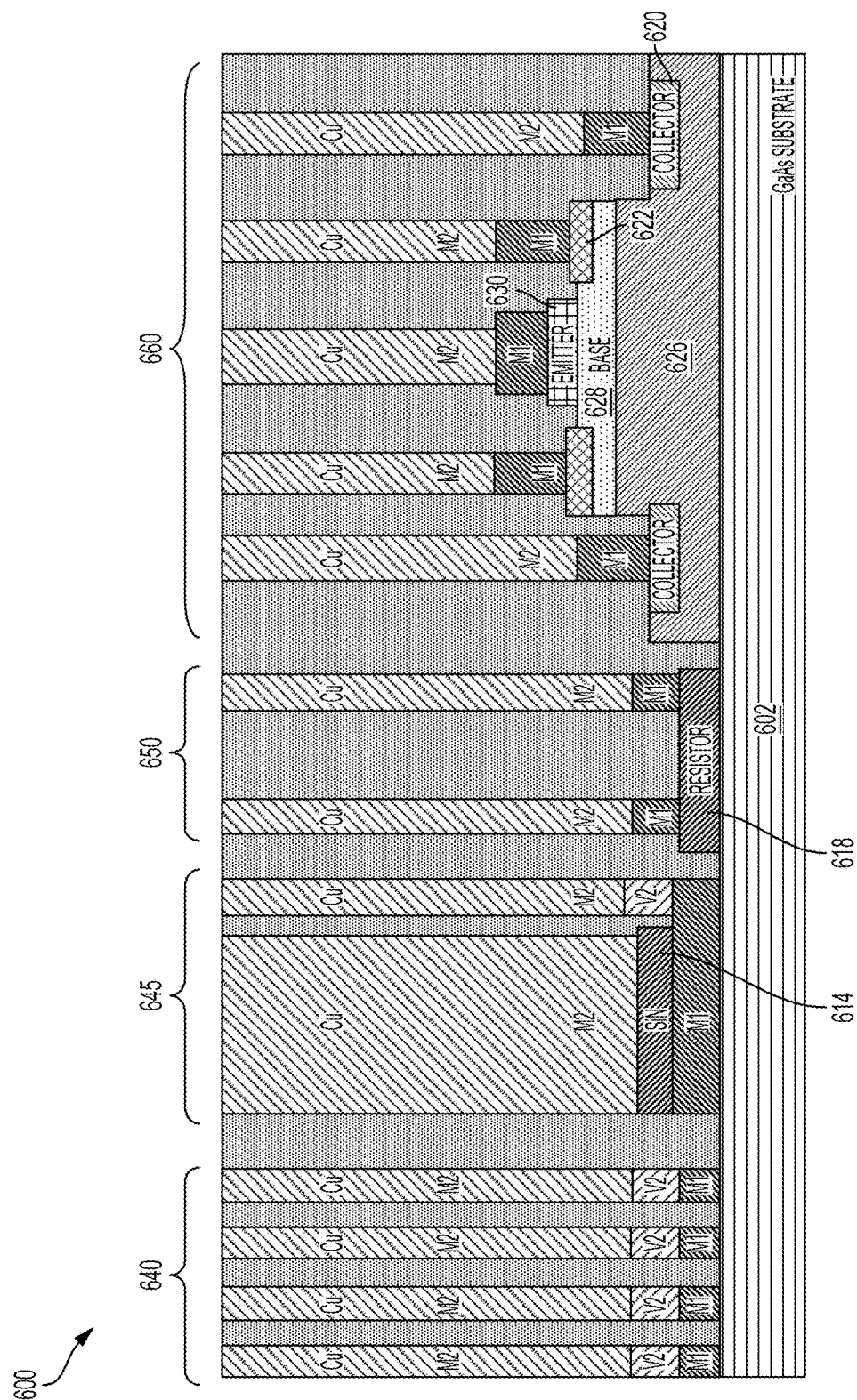
FIGS. 6A-6B illustrate cross-sectional views of a back-end-of-line (BEOL) interconnect layer in an integrated compound semiconductor circuit including passive and active devices according to aspects of the present disclosure.
Figure 6B:
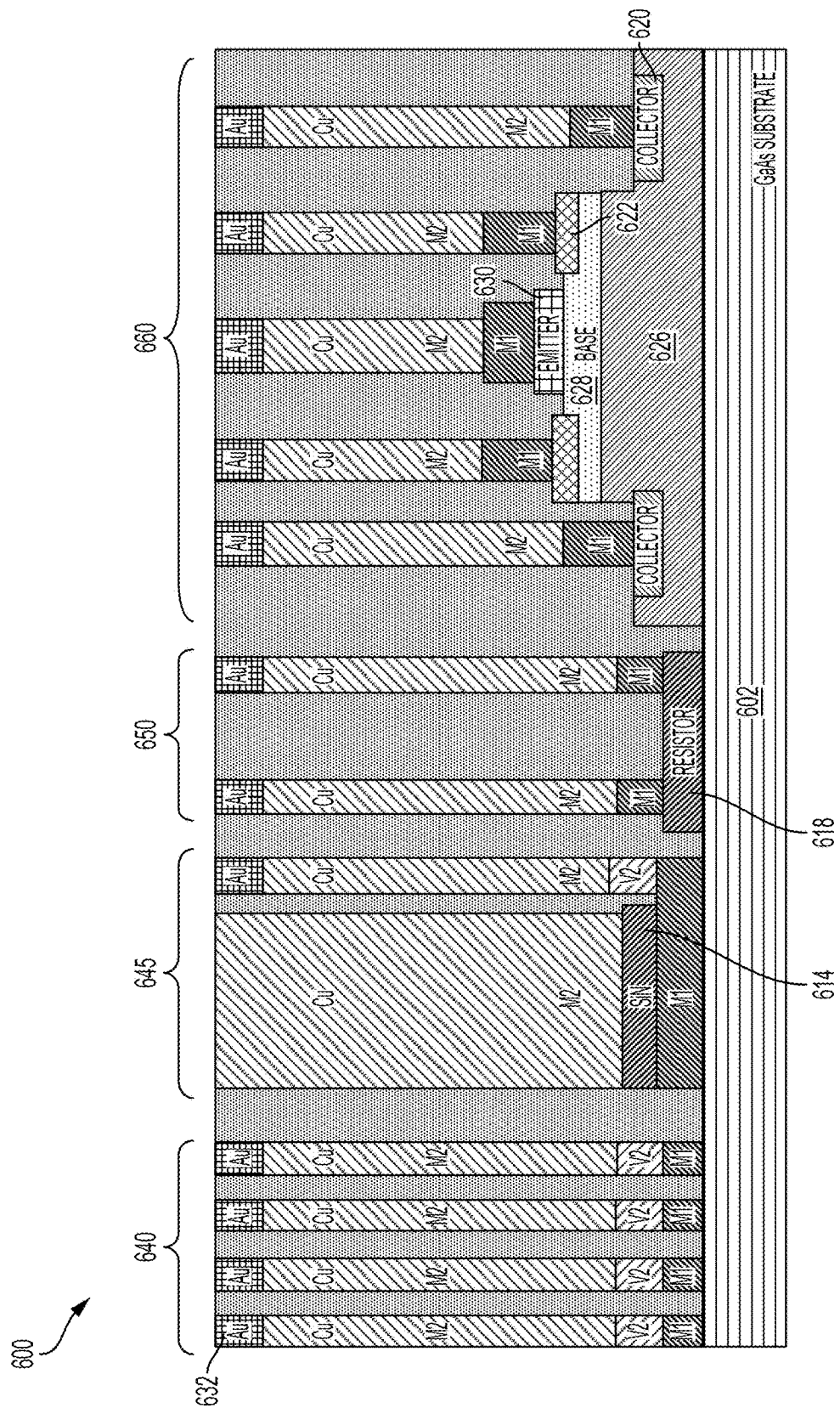

FIGS. 6A-6B illustrate cross-sectional views of a back-end-of-line interconnect layer in an integrated compound semiconductor circuit 600 including an inductor 640, a capacitor 645, a resistor 650, and an HBT 660 according to aspects of the present disclosure.

The integrated compound semiconductor circuit 600 may include a substrate 602 supporting each of the inductor 640, capacitor 645, resistor 650, and HBT 660. The integrated compound semiconductor circuit 600 may further include a first conductive interconnect layer M1, and a second conductive interconnect layer M2. The first conductive interconnect layer M1 and the second conductive interconnect layer M2 may include a conductive metal, such as copper Cu.

According to an aspect of the present disclosure, the second conductive interconnect layer M2 may further include a gold capping layer 632, as shown in FIG. 6B. Additionally, the second conductive interconnect layer M2 may include back-end-of-line vias similar to the back-end-of-line interconnect layer 520, as described above in FIG. 5. For example, the second conductive interconnect layer M2 may include a combination of gold Au and copper Cu layers, and also may include titanium nitride TiN or tantalum nitride TaN barrier layers, as described above with respect to FIG. 5.

According to related aspects, the inductor 640 and/or the capacitor 645 may be, for example, high-Q passive devices. In accordance with an aspect, the inductor 640 may include the first conductive interconnect layer M1 coupled to the second conductive interconnect layer M2 through vias V2.

According to an aspect of the present disclosure, the capacitor 645 may include a first portion of the first conductive interconnect layer M1 coupled to the second conductive interconnect layer M2 through a silicide layer 614 (e.g., SiNx), and second portion of the first conductive interconnect layer M1 coupled to the second conductive interconnect layer M2 through via V2. In accordance with an aspect, the first portion and the second portion do not overlap.

According to an aspect of the present disclosure, the resistor 650 may include a tantalum nitride (TaN) thin film resistor (TFR) 618. The first conductive interconnect layer M1 may be directly coupled to the second conductive interconnect layer M2. According to related aspects, the transistor 660 may be a heterojunction bipolar transistor (HBT) that includes a collector layer 626, a base layer 628 over the collector layer 626, and an emitter 630 over the base layer 628. A collector metal 620 may contact the collector layer 626, and base metal 622 may contact the base layer 628. Each of the collector metal 620, base metal 622, and emitter 630 may be directly coupled to the first conductive interconnect layer M1, which in turn, may be directly coupled to the second conductive interconnect layer M2.

According to an aspect, the substrate 602 may include a III-V compound semiconductor material, a II-VI compound semiconductor material, or other like compound semiconductor material.

Figure 7A:
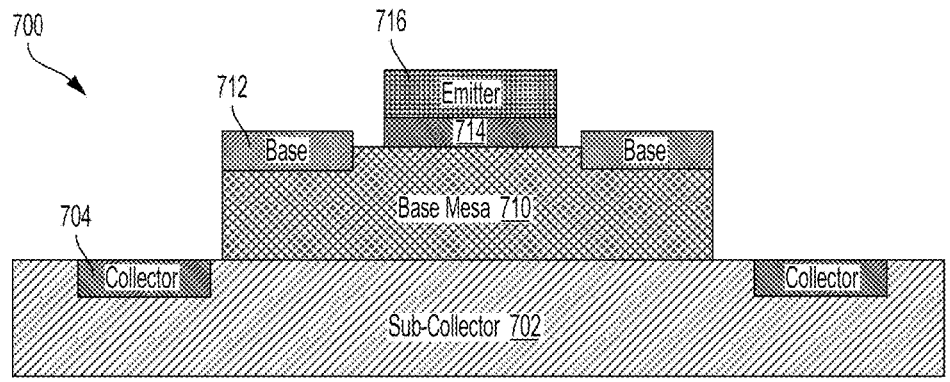
FIGS. 7A-7C illustrate fabrication of an integrated compound semiconductor device that includes an active device, according to aspects of the present disclosure.
Figure 7B:
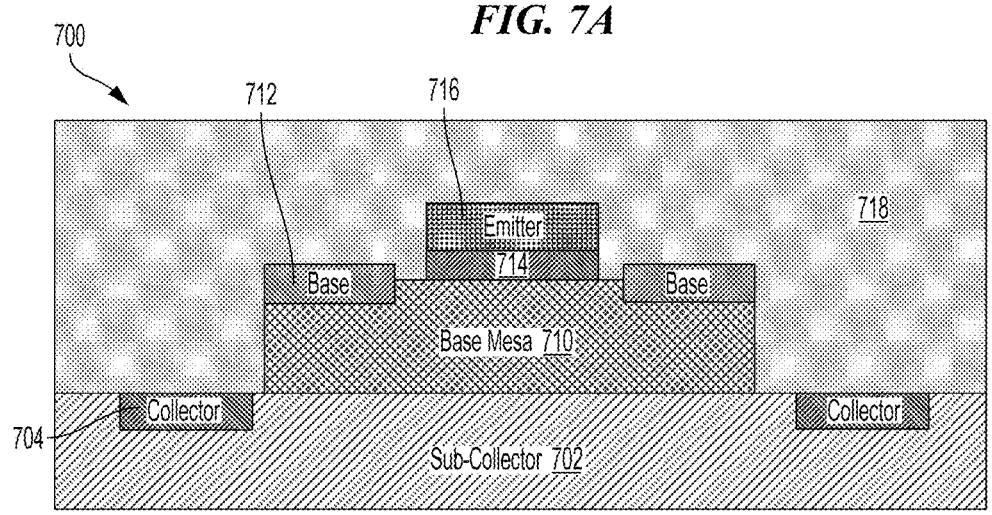
Figure 7C:
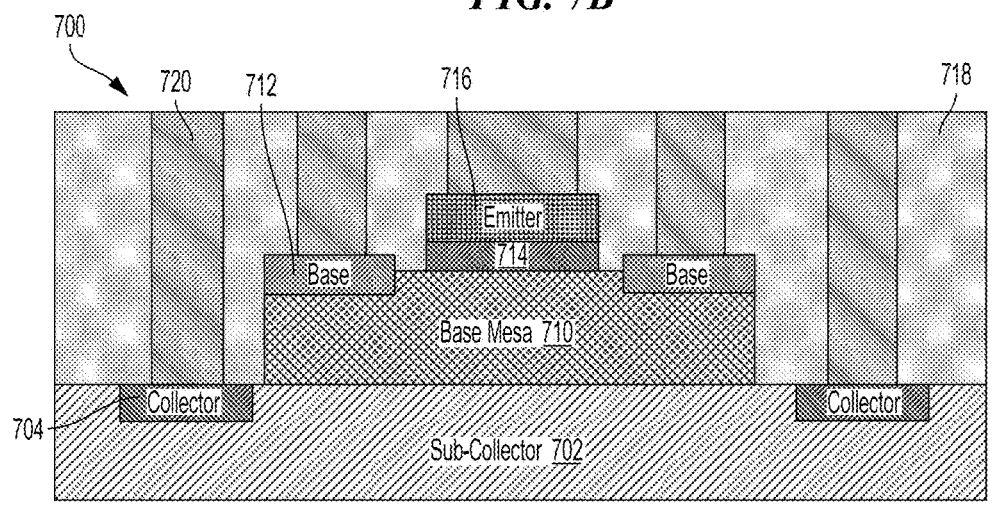

FIGS. 7A-7C illustrate fabrication of an integrated compound semiconductor device that includes an active device, according to aspects of the present disclosure.

FIG. 7A illustrates fabrication of a device 700 including a sub-collector layer 702 supporting a base mesa 710 and an emitter 714. The sub-collector layer 702, base mesa 710, and the emitter 714 may be epitaxial layers fabricated on a substrate (e.g., a III-V or II-VI semiconductor), as part of a compound semiconductor circuit, as shown in FIGS. 6A-6B. A collector contact 704 may be coupled to the sub-collector layer 702, a base contact 712 may be coupled to the base mesa 710, and an emitter contact 716 may be coupled to the emitter 714.

FIG. 7B illustrates a dielectric layer 718 deposited over the device 700. FIG. 7C illustrates back-end-of-line interconnects 720 etched through the dielectric layer 718. The back-end-of-line interconnects 720 may be multiple backside vias coupled to the collector contact 704, the base contact 712, and the emitter contact 716.

It is understood that the fabrication process illustrated herein applies to passive devices as well.

Figure 8:
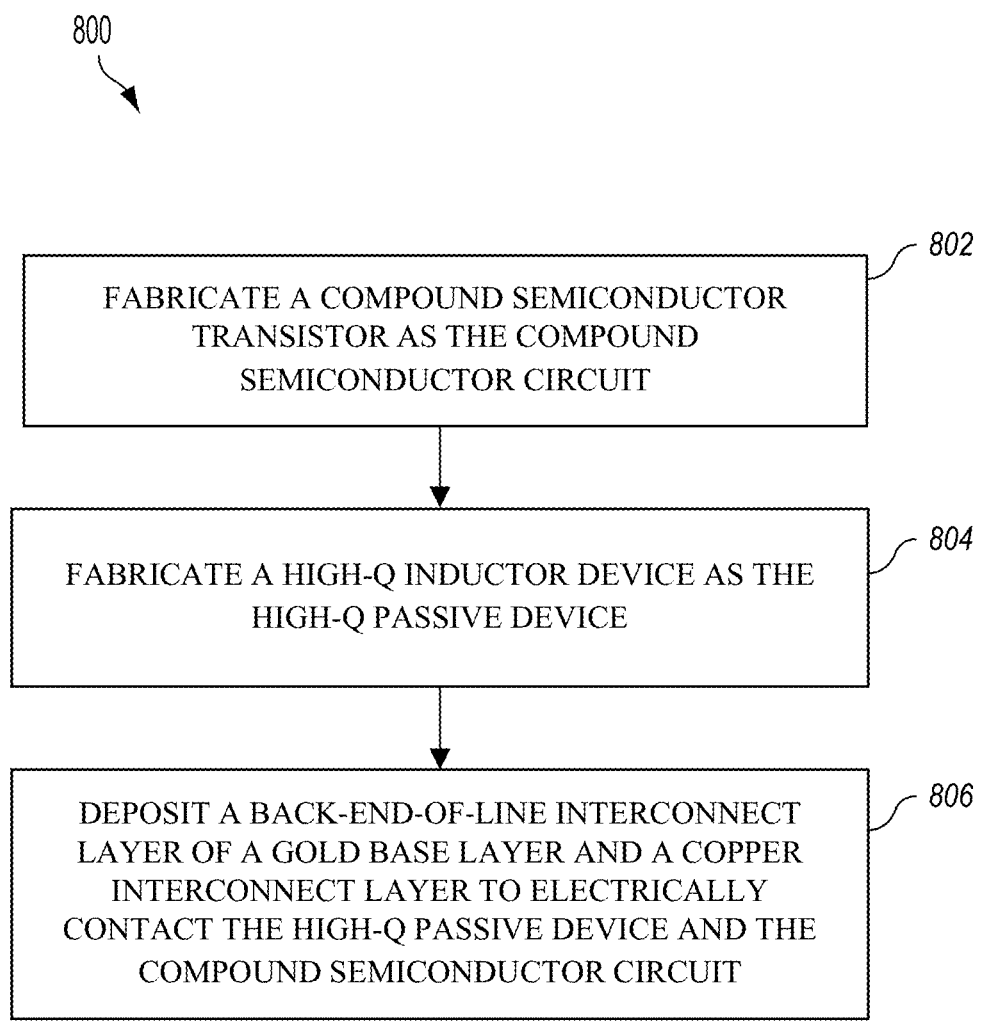
FIG. 8 illustrates a method of making an integrated compound semiconductor device that includes a high-Q passive device, according to aspects of the present disclosure.

FIG. 8 illustrates a method of making an integrated compound semiconductor device that includes a high-Q passive device, according to aspects of the present disclosure. In block 802, a compound semiconductor transistor is fabricated as the compound semiconductor circuit. For example, as shown in FIGS. 6A-6B, a heterojunction bipolar transistor (HBT) is fabricated as the compound semiconductor transistor. In block 804, a high-Q inductor device is fabricated as the high-Q passive device. For example, as shown in FIGS. 6A-6B, a 2D high-Q inductor is fabricated as the high-Q passive device.

Referring again to FIG. 8, in block 806, a back-end-of-line interconnect layer of a gold base layer and a copper interconnect layer is deposited to electrically contact the high-Q passive device and the compound semiconductor circuit. For example, as shown in FIG. 5, a back-end-of-line interconnect layer may include a copper diffusion barrier layer on an exposed surface of the compound semiconductor transistor and the high-Q inductor device.

As shown in FIG. 5, the copper diffusion barrier layer may include a titanium nitride (TiN) or a tantalum nitride (TaN) barrier liner on the exposed surface of the compound semiconductor transistor and the high-Q inductor device. A gold base layer is deposited on the copper diffusion barrier layer. In addition, a copper interconnect layer is deposited on the gold base layer. The copper interconnect layer may be capped with a gold capping layer. An additional copper diffusion layer (e.g., a second TiN or TaN barrier liner) may be deposited between the copper interconnect layer and the gold capping layer, for example, as shown in FIG. 5.

As described herein, compound semiconductor materials may include, but are not limited to, a compound semiconductor composed of gallium arsenide (GaAs), indium phosphide (InP), gallium nitride (GaN), gallium stibium (GaSb), gallium phosphide (GaP), indium gallium arsenide (InGaAs), aluminum gallium arsenide (AlGaAs), indium gallium phosphide (InGaP), aluminum gallium phosphide (AsGaP), aluminum gallium stibium (AlGaSb), indium gallium stibium (InGaSb), indium gallium nitride (InGaN), aluminum gallium nitride (AlGaN), indium gallium arsenide phosphide (InGaAsP), indium gallium arsenide stibium (InGaAsSb), or indium gallium arsenide:nitride (InGaAs:N).

It is understood that the method described above and herein applies to active devices as well.

According to a further aspect of the present disclosure, an integrated compound semiconductor device is described. The integrated compound semiconductor device may include means for providing inductance. The means for providing inductance may, for example, include a passive device 640, as shown in FIGS. 6A-6B. In another aspect, the aforementioned means may be any layer, module, or any apparatus configured to perform the functions recited by the aforementioned means.

A heterojunction bipolar transistor (HBT) is one example of a compound semiconductor transistor. A heterojunction bipolar transistor integrated circuit (HBT chip) may integrate a resistor, a capacitor, and a heterojunction bipolar transistor to provide, for example, a power amplifier. Aspects of the present disclosure replace the gold back-end-of-line interconnect layer with a copper back-end-of-line interconnect layer in an integrated compound semiconductor circuit including a high-Q passive device. One of the many benefits of using copper as a compound semiconductor (e.g., III-V, II-VI) back-end-of-line interconnect layer is reduced cost. In addition, a thermal conductivity of copper is approximately 1.4 times greater than the thermal conductivity of gold. A copper back-end-of-line interconnect layer, therefore, also solves a known heterojunction bipolar transistor thermal issue due to the substantially higher frequencies supported by compound semiconductor transistors. A copper back-end-of-line interconnect layer also enables a low cost integration of a compound semiconductor transistor (e.g., compound semiconductor field effect transistor, a heterojunction bipolar transistor, a high-electron-mobility-transistor (HEMT), etc.) with a high-Q inductor and a high density metal-insulator-metal (MIM) capacitor (CAP).

Figure 9:
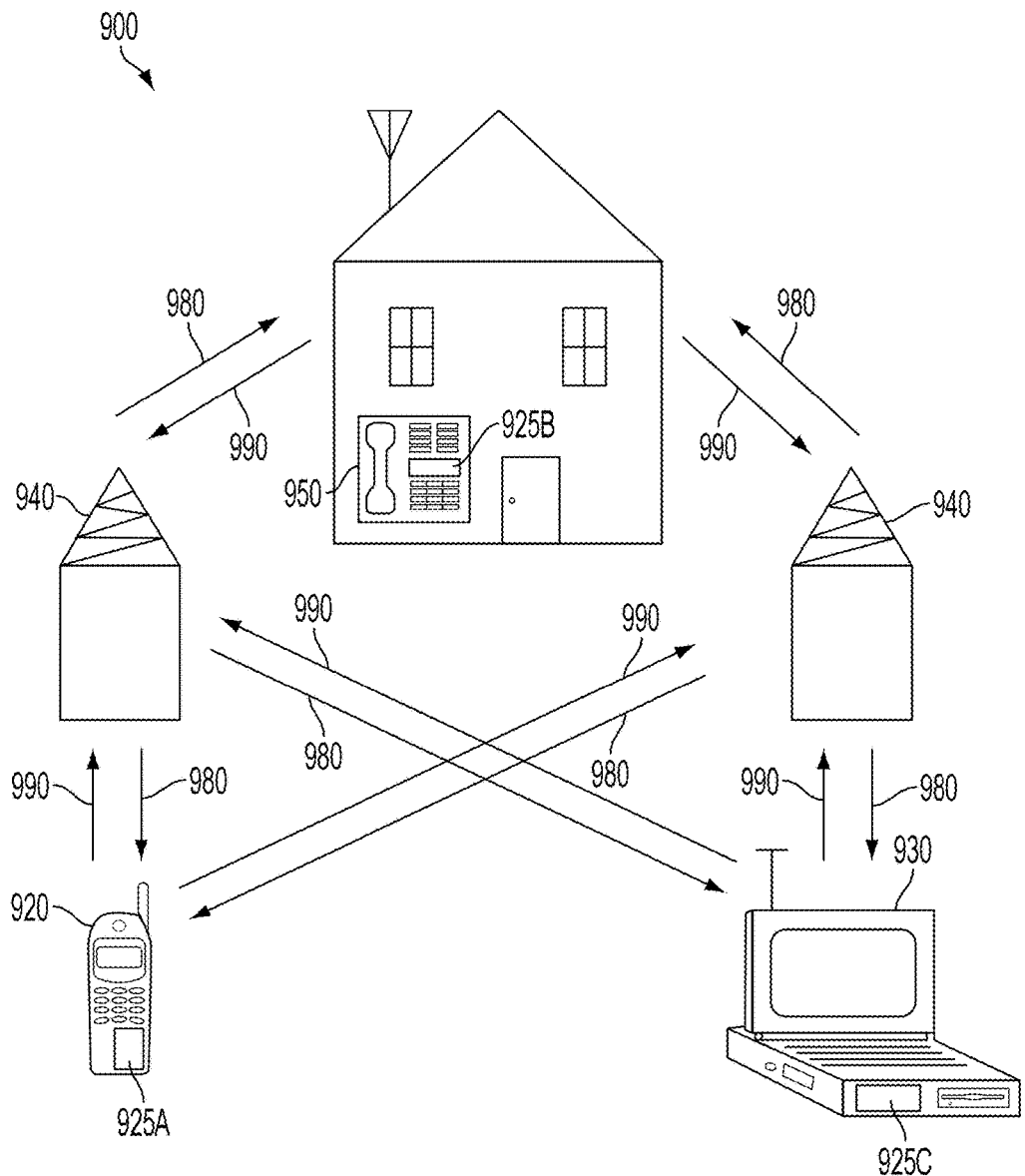
FIG. 9 is a block diagram showing an exemplary wireless communication system in which an aspect of the disclosure may be advantageously employed.

FIG. 9 is a block diagram showing an exemplary wireless communication system 900 in which an aspect of the disclosure may be advantageously employed. For purposes of illustration, FIG. 9 shows three of the remote units 920, 930, and 950 and two of the base stations 940. It will be recognized that wireless communication systems may have many more remote units and base stations. Remote units 920, 930, and 950 include IC devices 925A, 925C, and 925B that include the integrated compound semiconductor transistor and high-Q passive device. It will be recognized that other devices may also include the disclosed integrated compound semiconductor transistor and high-Q passive device, such as the base stations, switching devices, and network equipment. FIG. 9 shows forward link signals 980 from one of the base stations 940 to the remote units 920, 930, and 950 and reverse link signals 990 from the remote units 920, 930, and 950 to base stations 940.

In FIG. 9, one of the remote units 920 is shown as a mobile telephone, one of the remote units 930 is shown as a portable computer, and remote unit 950 is shown as a fixed location remote unit in a wireless local loop system. For example, the remote units may be a mobile phone, a hand-held personal communication systems (PCS) unit, a portable data unit such as a personal digital assistant (PDA), a GPS enabled device, a navigation device, a set top box, a music player, a video player, a communications device, an entertainment unit, a fixed location data unit such as a meter reading equipment, or other devices that store or retrieve data or computer instructions, or combinations thereof. Although FIG. 9 illustrates remote units according to the aspects of the disclosure, the disclosure is not limited to these exemplary illustrated units. Aspects of the disclosure may be suitably employed in many devices, which include the disclosed integrated compound semiconductor transistor and high-Q passive device.

Figure 10:
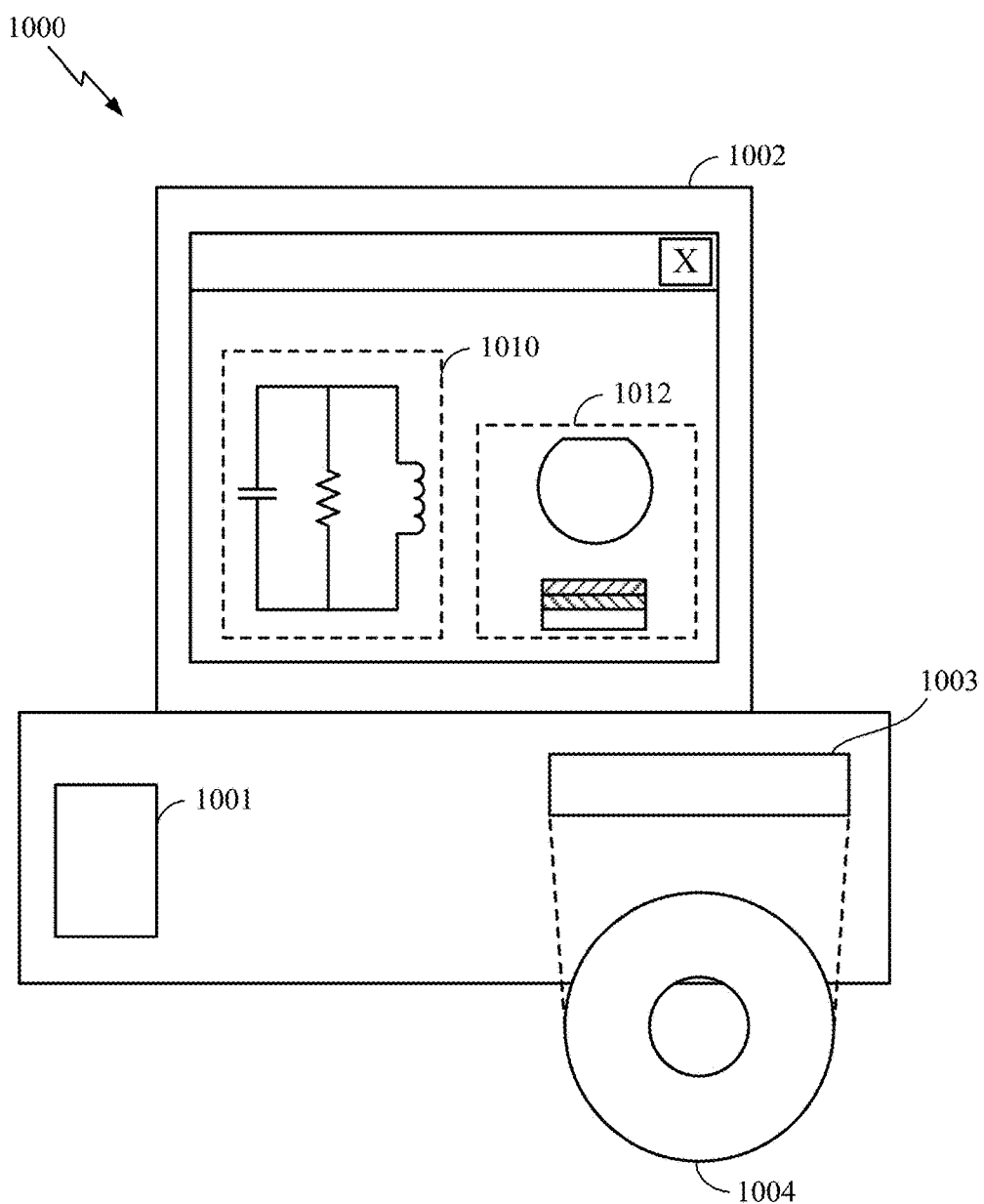
FIG. 10 is a block diagram illustrating a design workstation used for circuit, layout, and logic design.

FIG. 10 is a block diagram illustrating a design workstation used for circuit, layout, and logic design of the integrated compound semiconductor transistor and high-Q passive device disclosed herein. A design workstation 1000 includes a hard disk 1001 containing operating system software, support files, and design software such as Cadence or OrCAD. The design workstation 1000 also includes a display 1002 to facilitate design of a circuit 1010 or integrated compound semiconductor transistor and high-Q passive device 1012. A storage medium 1004 is provided for tangibly storing the design of the circuit 1010 or the integrated compound semiconductor transistor and high-Q passive device 1012. The design of the circuit 1010 or the integrated compound semiconductor transistor and high-Q passive device 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit 1010 or the integrated compound semiconductor transistor and high-Q passive device 1012 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described but is to be accorded the widest scope consistent with the principles and novel features disclosed herein.

What is claimed is:

1. An integrated compound semiconductor circuit including a high-Q passive device, comprising:
    a compound semiconductor transistor;
    a high-Q inductor device; and
    a back-end-of-line interconnect layer electrically contacting the high-Q inductor device and the compound semiconductor transistor, the back-end-of-line interconnect layer comprising a gold base layer and a copper interconnect layer.

2. The integrated compound semiconductor circuit of claim 1, in which the back-end-of-line interconnect layer comprises the gold base layer, a copper diffusion barrier layer and the copper interconnect layer.

3. The integrated compound semiconductor circuit of claim 1, in which the back-end-of-line interconnect layer comprises a gold capping layer.

4. The integrated compound semiconductor circuit of claim 1, further comprising a metal-insulator-metal (MIM) capacitor electrically coupled to the high-Q inductor device.

5. The integrated compound semiconductor circuit of claim 1, in which the compound semiconductor transistor comprises a high-electron-mobility-transistor (HEMT).

6. The integrated compound semiconductor circuit of claim 1, in which the compound semiconductor transistor comprises a heterojunction bipolar transistor (HBT).

7. The integrated compound semiconductor circuit of claim 1, in which the compound semiconductor transistor comprises gallium arsenide (GaAs), gallium nitride (GaN), indium gallium arsenide (InGaAs), aluminum gallium arsenide (AlGaAs), indium gallium nitride (InGaN), or aluminum gallium nitride (AlGaN).

8. The integrated compound semiconductor circuit of claim 1, in which the high-Q inductor device comprises a 2D spiral inductor.

9. The integrated compound semiconductor circuit of claim 1, integrated into a chip incorporated into at least one of a music player, a video player, an entertainment unit, a navigation device, a communications device, a personal digital assistant (PDA), a fixed location data unit, a mobile phone, and a portable computer.

10. A method of making an integrated compound semiconductor circuit including a high-Q passive device, comprising:
    fabricating a compound semiconductor transistor;
    fabricating a high-Q inductor device; and
    depositing a back-end-of-line interconnect layer of a gold base layer and a copper interconnect layer to electrically contact the high-Q inductor device and the compound semiconductor transistor.

11. The method of claim 10, further comprising depositing a gold capping layer on the copper interconnect layer.

12. The method of claim 10, further comprising fabricating a metal-insulator-metal (MIM) capacitor electrically contacting the high-Q inductor device.

13. The method of claim 10, in which depositing the back-end-of-line interconnect layer comprises:
    exposing the compound semiconductor transistor and the high-Q inductor device;
    depositing a copper diffusion barrier layer on an exposed surface of the compound semiconductor transistor and the high-Q inductor device;
    depositing the gold base layer on the copper diffusion barrier layer; and
    depositing the copper interconnect layer on the gold base layer.

14. The method of claim 10, further comprising integrating the integrated compound semiconductor circuit into a chip, the chip incorporated into at least one of a music player, a video player, an entertainment unit, a navigation device, a communications device, a personal digital assistant (PDA), a fixed location data unit, a mobile phone, and a portable computer.

15. A radio frequency (RF) front end module, comprising:
    a chip, comprising a compound semiconductor transistor, a high-Q inductor device, and a back-end-of-line interconnect layer electrically contacting the high-Q inductor device and the compound semiconductor transistor, the back-end-of-line interconnect layer comprising a gold base layer and a copper interconnect layer; and
    an antenna coupled to an output of the chip.

16. The RF front end module of claim 15, in which the back-end-of-line interconnect layer comprises the gold base layer, a copper diffusion barrier layer and the copper interconnect layer.

17. The RF front end module of claim 15, in which the back-end-of-line interconnect layer comprises a gold capping layer.

18. The RF front end module of claim 15, in which the compound semiconductor transistor comprises a high-electron-mobility-transistor (HEMT).

19. The RF front end module of claim 15, in which the compound semiconductor transistor comprises a heterojunction bipolar transistor (HBT).

20. The RF front end module of claim 15, incorporated into at least one of a music player, a video player, an entertainment unit, a navigation device, a communications device, a personal digital assistant (PDA), a fixed location data unit, a mobile phone, and a portable computer.

21. An integrated compound semiconductor circuit, comprising:
    a compound semiconductor transistor;
    a means for providing inductance; and
    a back-end-of-line interconnect layer electrically contacting the means for providing inductance and the compound semiconductor transistor, the back-end-of-line interconnect layer comprising a gold base layer and a copper interconnect layer.

22. The integrated compound semiconductor circuit of claim 21, in which the back-end-of-line interconnect layer comprises the gold base layer, a copper diffusion barrier layer and the copper interconnect layer.

23. The integrated compound semiconductor circuit of claim 21, in which the back-end-of-line interconnect layer comprises a gold capping layer.

24. The integrated compound semiconductor circuit of claim 21, further comprising a metal-insulator-metal (MIM) capacitor electrically coupled to the means for providing inductance.

25. The integrated compound semiconductor circuit of claim 21, in which the compound semiconductor transistor comprises a high-electron-mobility-transistor (HEMT).

26. The integrated compound semiconductor circuit of claim 21, in which the compound semiconductor transistor comprises a heterojunction bipolar transistor (HBT).

27. The integrated compound semiconductor circuit of claim 21, integrated into a chip incorporated into at least one of a music player, a video player, an entertainment unit, a navigation device, a communications device, a personal digital assistant (PDA), a fixed location data unit, a mobile phone, and a portable computer.

\* \* \* \* \*